(12) United States Patent
Kim et al.

(10) Patent No.: US 7,711,340 B2
(45) Date of Patent: May 4, 2010

(54) PHASE LOCKED LOOP AND METHOD THEREOF

(75) Inventors: Kwang-ho Kim, Yongin-si (KR); Je-kook Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 566 days.

(21) Appl. No.: 11/656,472

(22) Filed: Jan. 23, 2007

(65) Prior Publication Data

US 2007/0173219 A1 Jul. 26, 2007

(30) Foreign Application Priority Data

Jan. 24, 2006 (KR) .................... 10-2006-0007266

(51) Int. Cl.
*H04B 1/06* (2006.01)
*H04Q 7/20* (2006.01)

(52) U.S. Cl. .................... 455/260; 331/17; 375/374

(58) Field of Classification Search .................... 455/76, 455/180.3, 260; 331/17; 375/374–376
See application file for complete search history.

(56) References Cited

U.S. PATENT DOCUMENTS 6,888,413 B1 * 5/2005 Adams et al. ................ 331/17
6,949,981 B2 * 9/2005 Natonio et al. ............... 331/17

* cited by examiner

*Primary Examiner*—Lee Nguyen
(74) *Attorney, Agent, or Firm*—Harness, Dickey & Pierce, P.L.C.

(57) ABSTRACT

A phase locked loop and method thereof are provided. The example phase locked loop may include a loop filter filtering a charge pump output signal to generate a voltage signal and a voltage-controlled oscillator configured to operate in a given one of a plurality of frequency zones, the given frequency zone within which the voltage-controller oscillator is operating in being based on a voltage level of the voltage signal, the voltage-controlled oscillator outputting an oscillator signal at a frequency corresponding to the voltage level of the voltage signal output from the loop filter. The example method may include filtering a charge pump output signal to generate a voltage signal and outputting an oscillator signal at a frequency corresponding to a voltage level of the voltage signal, the frequency of the oscillator signal based on which of a plurality of frequency zones is currently selected, the currently selected frequency zone being selected based on the voltage level of the voltage signal.

30 Claims, 10 Drawing Sheets

PHASE LOCKED LOOP AND METHOD THEREOF

PRIORITY STATEMENT

This application claims the benefit of Korean Patent Application No. 10-2006-0007266, filed on Jan. 24, 2006, in the Korean Intellectual Property Office, the disclosure of which is incorporated herein in its entirety by reference.

BACKGROUND OF THE INVENTION

1. Field of the Invention

Example embodiments of the present invention are directed generally to a phase locked loop and method thereof, and more particularly to a phase locked loop configured to selectively operate in one of a plurality of frequency zones and method thereof.

2. Description of Related Art

A conventional phase locked loop (PLL) may be a frequency feedback circuit generating a signal having an arbitrary frequency in response to a frequency of a signal input from an external source. The PLL may synchronize phases of reference and oscillator signals by detecting a phase difference between the reference and oscillator signals and adjusting the frequency of the oscillator signal to a given frequency using an up/down signal based on the detected phase difference. PLLs may be deployed within frequency synthesis circuits and clock recovery circuits used in data processing circuits.

Figure 1:
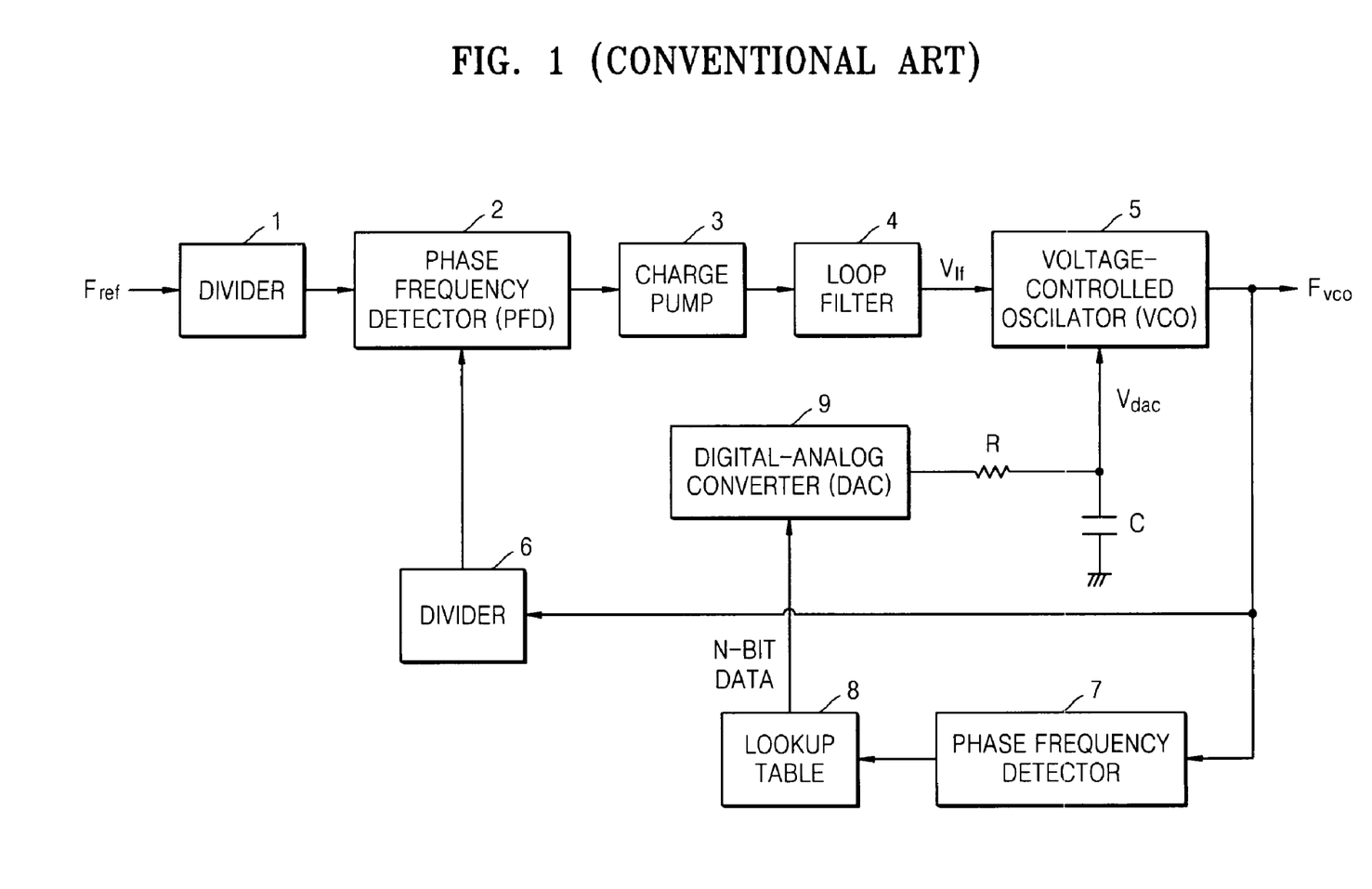
FIG. 1 is a block diagram of a conventional phase locked loop (PLL).

FIG. 1 is a block diagram of a conventional PLL. As illustrated in FIG. 1, the PLL may include a divider 1, a phase frequency detector (PFD) 2, a charge pump 3, a loop filter 4, a voltage-controlled oscillator 5 and a divider 6.

Referring to FIG. 1, the divider 1 may divide the frequency of a reference signal Fref and may output the frequency-divided signal to the phase frequency detector 2. The phase frequency detector 2 may receive the frequency-divided signal from the divider 1 and an oscillator signal fed back from the voltage-controlled oscillator 5 as inputs, may compare the phases and frequencies of the two signals, and may output a signal based on the comparison result to the charge pump 3.

Referring to FIG. 1, the charge pump 3 may provide current corresponding to the comparison result output from the phase frequency detector 2 to the loop filter 4. The loop filter 4 may filter an output signal of the charge pump 3 and may provide a voltage signal Vlf to the voltage-controlled oscillator 5.

Referring to FIG. 1, the voltage-controlled oscillator 5 may generate an oscillator signal Fvco having a given frequency corresponding to the voltage signal Vlf output from the loop filter 4 and may provide the generated oscillator signal Fvco to an external circuit (not shown). The divider 6 may divide the oscillator signal Fvco output from the voltage-controlled oscillator 5 and may output the divided signal to another input terminal of the phase frequency detector 2 as a feedback signal.

Referring to FIG. 1, the voltage-controlled oscillator 5 may select one of the plurality of a frequency zones in which to operate as an operating frequency zone in response to a given control signal. In addition, the operating frequency zone may adjusted in response to a change of the control signal.

Referring to FIG. 1, the PLL may further include a frequency detector 7, a look-up table 8 and a digital-analog converter (DAC) 9. The frequency detector 7 may detect the frequency of the oscillator signal Fvco and may output a signal based on the result of the detection to the look-up table 8. The lookup table 8 may output, to the digital-analog converter 9, a given N-bit zone control signal N-BIT DATA in response to the signal output from the frequency detector 7 to the digital-analog converter 9. The digital-analog converter 9 may convert the received N-bit zone control signal (N-BIT DATA) into an analog signal and may output the analog signal to the voltage-controlled oscillator 5. The voltage-controlled oscillator 5 may select the operating frequency zone corresponding to the analog signal output from the digital-analog converter 9. Accordingly, the voltage-controlled oscillator 5 may generate an oscillator signal Fvco having a frequency based on the voltage signal Vlf in response to a characteristic graph of the selected operating frequency zone. A resistor R and a capacitor C illustrated in FIG. 1 may constitute a lower-pass filter, which may enable a slower shift from one operating frequency zone to another in response to control signal change.

Figure 2:
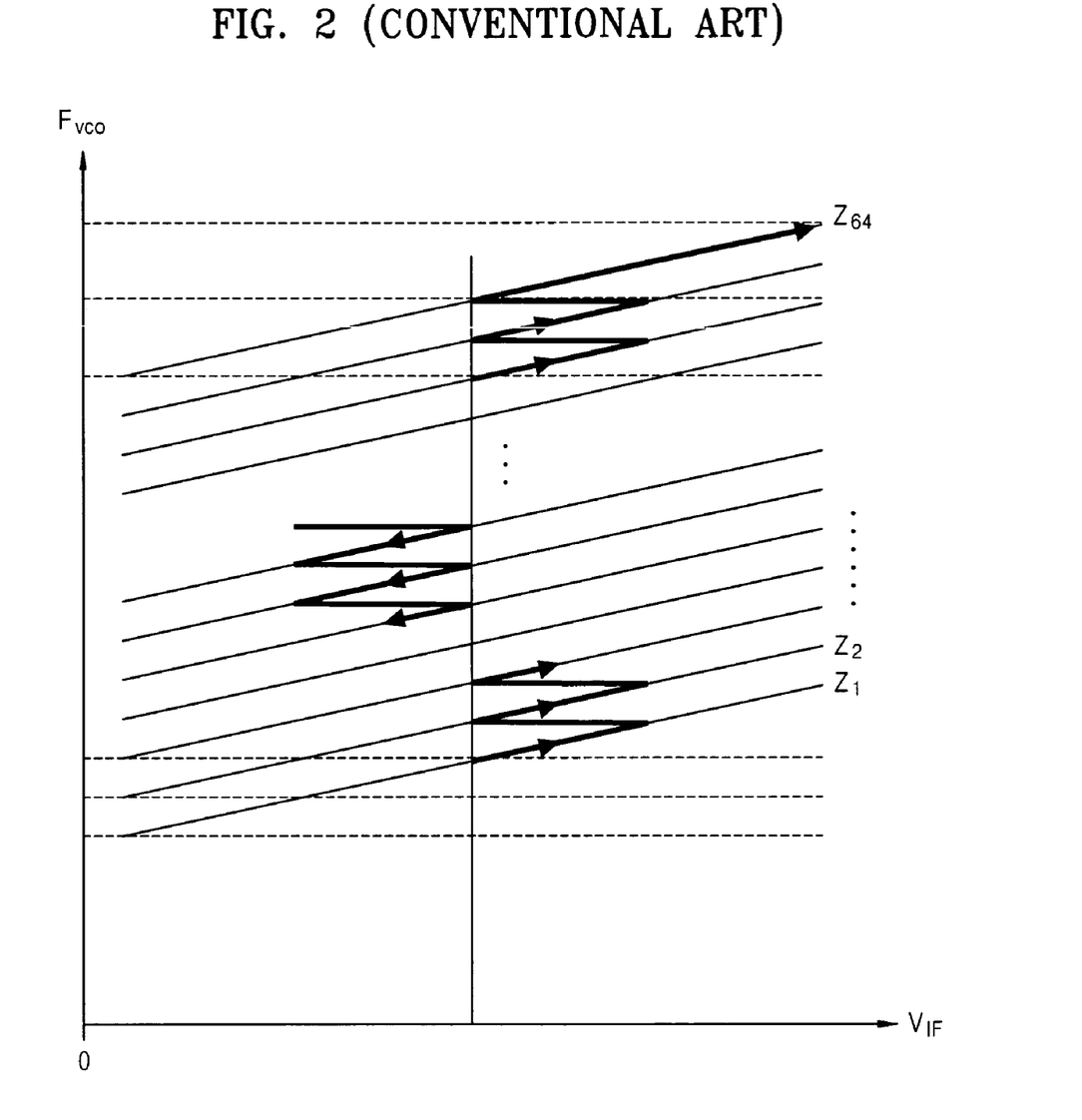
FIG. 2 is a graph illustrating voltage-frequency characteristics based on an operation of the conventional PLL of FIG. 1.

FIG. 2 is a graph illustrating voltage-frequency characteristics based on an operation of the conventional PLL of FIG. 1. In the graph in FIG. 2, the horizontal axis may denote a voltage signal Vlf input to the voltage-controlled oscillator 5, and the vertical axis may denote the frequency of the oscillator signal Fvco of the voltage-controlled oscillator 5. In particular, FIG. 2 illustrates the plurality of operating frequency zones within which the voltage-controlled oscillator 5 may operate. For example, the plurality of frequency zones may include sixty four frequency zones Z1 to Z64 and the N-bit zone control signal (N-BIT DATA) may include 6 bits to distinguish between the sixty four frequency zones.

Referring to FIGS. 1 and 2, the frequency of the oscillator signal Fvco of the voltage-controlled oscillator 5 may be increased as the level of the voltage signal Vlf input to the voltage-controlled oscillator 5 increases. The N-bit zone control signal (N-BIT DATA) corresponding to a frequency measured using the look-up table 8 may be output to the digital-analog converter 9 if the frequency of the oscillator signal Fvco is greater than or equal to a given threshold value or, alternatively, less than or the given threshold value. The voltage-controlled oscillator 5 may select a different frequency zone if the N-bit zone control signal (N-BIT DATA) is changed, and may thereby generate the oscillator signal Fvco at a frequency corresponding to the voltage signal Vlf (e.g., as shown in the graph of FIG. 2).

However, in the conventional PLL of FIG. 1, a range associated with a given frequency step or zone of the frequency zones may change due to variations in process, voltage, temperature, etc. Accordingly, the frequency zones may not remain constant during operation. Accordingly, the shape of the frequency graph of the oscillator signal Fvco corresponding to the level of the voltage signal Vlf may change.

In order to reduce frequency zone fluctuation, a calibration process may be used. In the calibration process, each of the plurality of frequency zones may be measured at an initial PLL calibration, and the measured frequency zones may be stored to calibrate the PLL. However, the time required to calibrate the PLL may increase and an accuracy of the calibration decreases (e.g., during an operation of the PLL). Further, it may be difficult to re-calibrate the PLL during an operation of the PLL. Also, if a gain Kvco of the voltage-controlled oscillator becomes non-linear due to a change in the shape of the frequency graph, it may be more difficult to detect the frequency zones, and it may thereby become more difficult to synchronize the phase of an output signal to the reference signal.

SUMMARY OF THE INVENTION

An example embodiment of the present invention is directed to a phase locked loop, including a loop filter filtering a charge pump output signal to generate a voltage signal and a voltage-controlled oscillator configured to operate in a given one of a plurality of frequency zones, the given frequency zone within which the voltage-controller oscillator is operating in being based on a voltage level of the voltage signal, the voltage-controlled oscillator outputting an oscillator signal at a frequency corresponding to the voltage level of the voltage signal output from the loop filter.

Another example embodiment of the present invention is directed to a method of operating a phase locked loop, including filtering a charge pump output signal to generate a voltage signal and outputting an oscillator signal at a frequency corresponding to a voltage level of the voltage signal, the frequency of the oscillator signal based on which of a plurality of frequency zones is currently selected, the currently selected frequency zone being selected based on the voltage level of the voltage signal.

Another example embodiment of the present invention is directed to a phase locked loop capable of reducing a calibration process of a phase locked loop during an operation of the phase locked loop irrespective of changes to an initial operation conditions (e.g., variations in voltage, temperature, etc.).

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
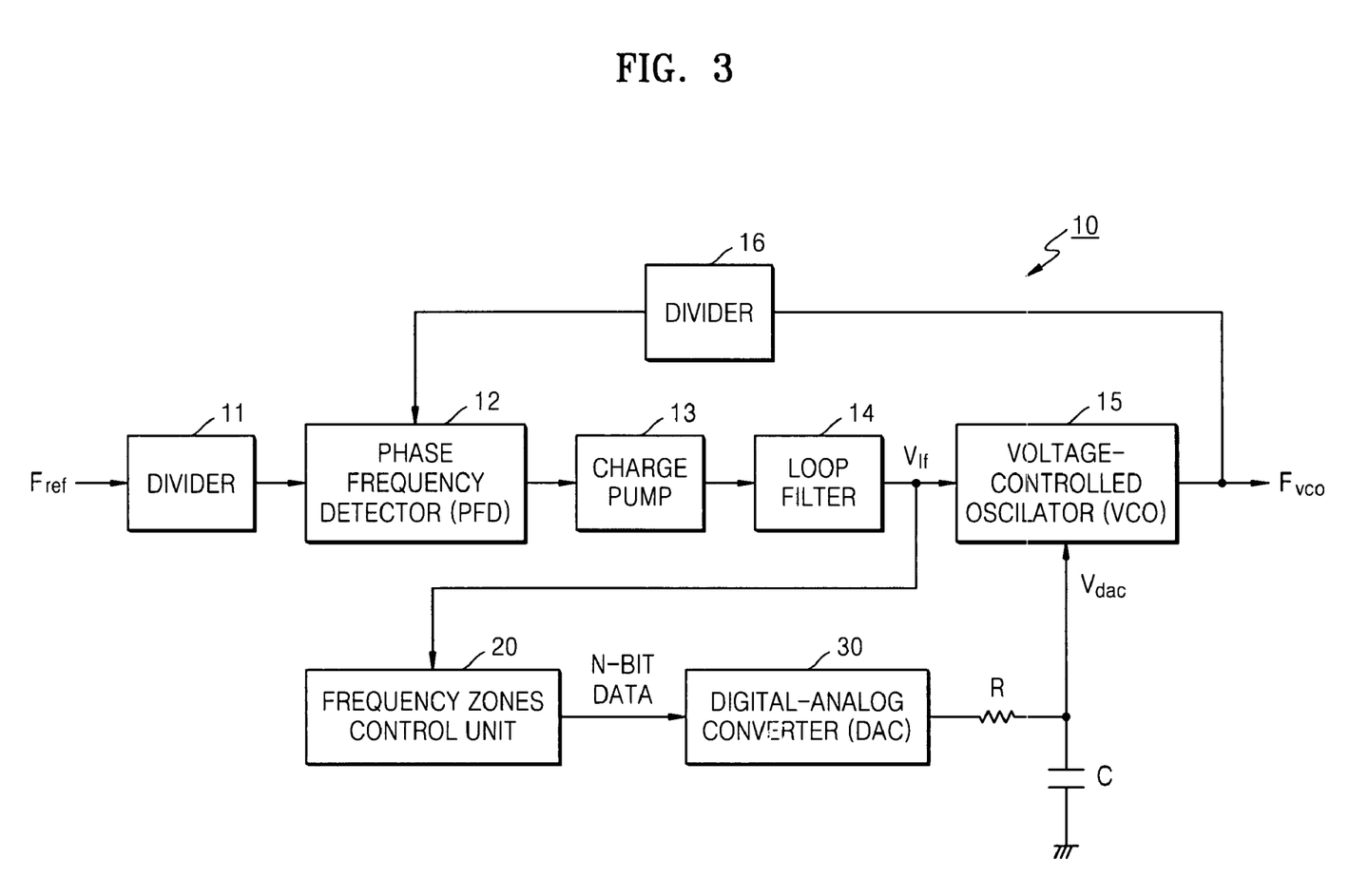
FIG. 3 is a block diagram of a PLL according to an example embodiment of the present invention.

FIG. 3 is a block diagram of a phase locked loop (PLL) 10 according to an example embodiment of the present invention. In the example embodiment of FIG. 3, the PLL may include a divider 11, a phase frequency detector (PFD) 12, a charge pump 13, a loop filter 14, a voltage-controlled oscillator (VCO) 15 and a divider 16. In an example, elements 11 through 16 of FIG. 3 may be structurally and functionally similar to corresponding components within conventional FIG. 1 and described in the Background of the Invention section, and as such a further description of certain structural or functional characteristics of these elements has been omitted for the sake of brevity.

In the example embodiment of FIG. 3, a reference signal Fref may be input to the PFD 12 through the divider 11. The PFD 12 may receive the output signal of the divider 11 and an oscillator signal Fvco (e.g., a feedback signal from the VCO 15), may compare the phases and frequencies of the two received signals and may output a signal based on the result of the comparison to the charge pump 13.

In the example embodiment of FIG. 3, the charge pump 13 may provide the loop filter 14 with a current corresponding to the signal output from the charge pump 13. The loop filter 14 may provide a voltage signal Vlf to the VCO 15 corresponding to the current. The voltage-controlled oscillator 15 may generate the oscillator signal Fvco with a given frequency corresponding to the voltage signal Vlf output from the loop filter 14 and may output the oscillator signal Fvco to an external circuit (not shown).

In the example embodiment of FIG. 3, the VCO 15 may operate in one of a plurality of frequency zones in response to a given control voltage Vdac. The PLL 10 may further include a frequency zones control unit 20 as well as a digital-analog converter 30 to convert a digital signal output from the frequency zones control unit 20 into an analog signal.

In the example embodiment of FIG. 3, the frequency zones control unit 20, which may be connected to the loop filter 14, may receive the voltage signal Vlf output from the loop filter 14 as an input. The frequency zones control unit 20 may output an N-bit zone control signal (N-BIT DATA) based on an initial value (e.g., which may be set in advance). The VCO 15 may operate in a frequency zone corresponding to the N-bit zone control signal (N-BIT DATA).

In the example embodiment of FIG. 3, if the frequency of the oscillator signal Fvco is less than that of the reference signal Fref, the level of the voltage signal Vlf input to the frequency zones control unit 20 may increase (e.g., gradually), and the frequency of the oscillator signal Fvco may likewise be increased. If the level of the voltage signal Vlf is greater than or equal to a given first level, the frequency zones control unit 20 may increase (e.g., increment) the N-bit zone control signal (N-BIT DATA) (e.g., by one) and may output the increased N-bit zone control signal (N-BIT DATA). The VCO 15 may generate the oscillator signal Fvco based on voltage-frequency characteristics of the frequency zone corresponding to the increased N-bit zone control signal (N-BIT DATA).

In the example embodiment of FIG. 3, in an alternative example, if the frequency of the oscillator signal Fvco is greater than that of the reference signal Fref, the level of the voltage signal Vlf input to the frequency zones control unit 20 may decrease (e.g., gradually), and the frequency of the oscillator signal Fvco may likewise be decreased. If the level of the voltage signal Vlf is less than or equal to a given second level, the frequency zones control unit 20 may decrease (e.g., decrement) the N-bit zone control signal (N-BIT DATA) (e.g., by one) and may output the decreased N-bit zone control signal (N-BIT DATA). The VCO 15 may generate the oscillator signal Fvco based on voltage-frequency characteristics of a frequency zone corresponding to the decreased N-bit zone control signal (N-BIT DATA).

In the example embodiment of FIG. 3, the digital-analog converter 30 may be positioned between the frequency zones control unit 20 and the VCO 15. The digital-analog converter 30 may receive the N-bit zone control signal (N-BIT DATA) from the frequency zones control unit 20 and may convert the N-bit zone control signal (N-BIT DATA) into an analog signal. A control voltage Vdac (e.g., an analog signal) may be input to the VCO 15, and the VCO 15 may operate in a frequency zone corresponding to the level of the control voltage Vdac.

Figure 4:
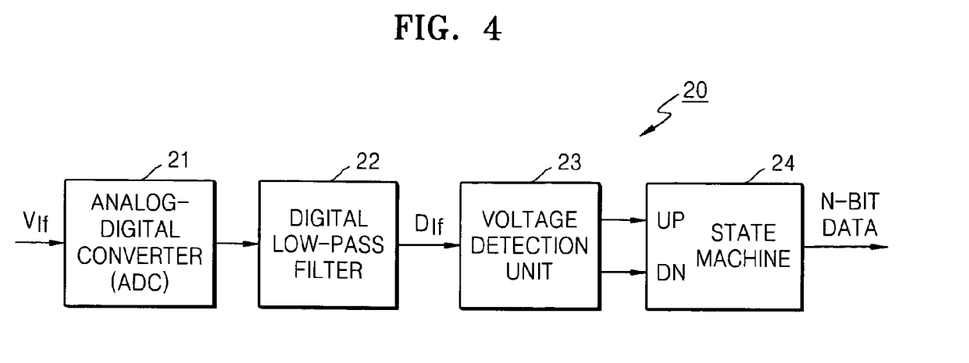
FIG. 4 is a block diagram of a frequency zones control unit of the PLL in FIG. 3 according to another example embodiment of the present invention.

FIG. 4 is a block diagram of the frequency zones control unit 20 of the PLL in FIG. 3 according to another example embodiment of the present invention.

In the example embodiment of FIG. 4, the frequency zones control unit 20 may receive the voltage signal Vlf as an input and may output the N-bit zone control signal (N-BIT DATA). The frequency zones control unit 20 may include an analog-digital converter 21, a digital low-pass filter 22, a voltage detection unit 23 and a state machine 24.

In the example embodiment of FIG. 4, the analog-digital converter 21 may receive the voltage signal Vlf (e.g., an analog signal) as an input and may convert the voltage signal Vlf into a digital signal. The digital low pass filter 22 may reduce noise within the voltage signal Vlf by filtering the digital signal so as to pass a lower band of the signal.

In the example embodiment of FIG. 4, a digital signal Dlf output from the digital low pass filter 22 may be input to the voltage detection unit 23. The voltage detection unit 23 may detect the level of the voltage signal Vlf from the input digital signal Dlf. The voltage detection unit 23 may detect whether the level of the voltage signal Vlf is greater than or equal to the given first level. In addition, the voltage detection unit 23 may detect whether the level of the voltage signal Vlf is less than or equal to the given second level. The voltage detection unit 23 may output a detection signal according to the result of the voltage detection and threshold comparisons. For example, the voltage detection unit 23 may output an activated up-count signal UP (e.g., a first logic level, such as a higher logic level or logic "1") if the level of the voltage signal Vlf is greater than or equal to the given first level and an activated down-count signal DN if the level of the voltage signal Vlf is less than or equal to the given second level.

In the example embodiment of FIG. 4, the state machine 24 may generate and output the N-bit zone control signal (N-BIT DATA) in response to the detection signal. If the activated up-count signal UP is input to the state machine 24, the state machine 24 may increase (e.g., increment) the N-bit zone control signal (N-BIT DATA) (e.g., by one) and may output the increased N-bit zone control signal (N-BIT DATA). Alternatively, if an activated down-count signal DN is input to the state machine 24, the state machine 24 may decrease (e.g., decrement) the N-bit zone control signal (N-BIT DATA) (e.g., by one) and may output the decreased N-bit zone control signal (N-BIT DATA).

Figure 5:
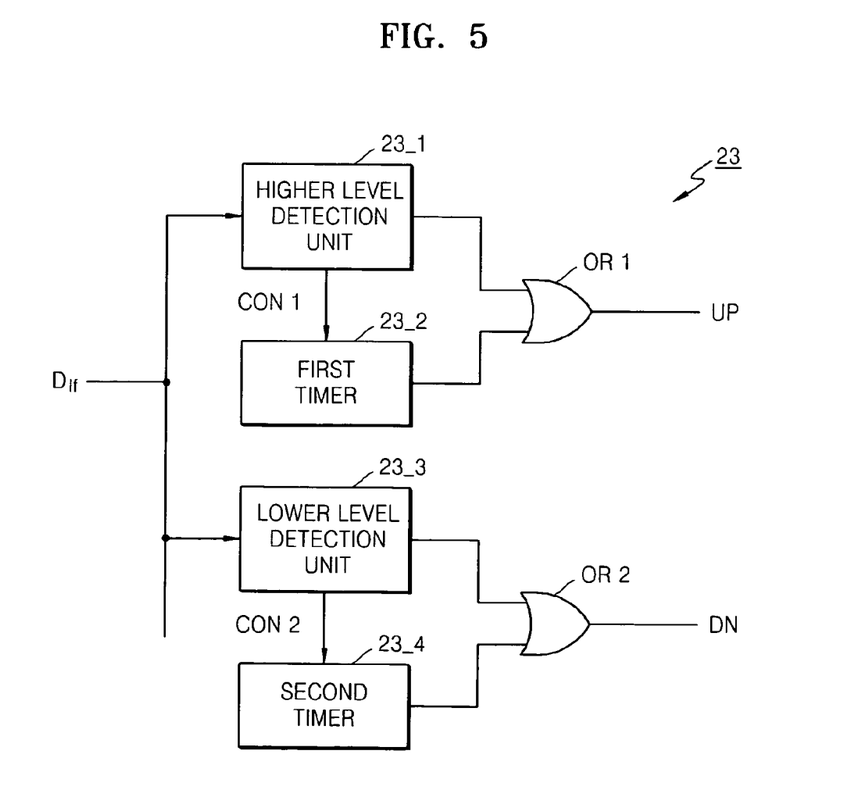
FIG. 5 is a block diagram of a voltage detection unit of the frequency zones control unit of FIG. 4 according to another example embodiment of the present invention.

FIG. 5 is a block diagram of the voltage detection unit 23 of the frequency zones control unit 20 of FIG. 4 according to another example embodiment of the present invention. In the example embodiment of FIG. 5, the voltage detection unit 23 may include a higher level detection unit $23\_1$ and a lower level detection unit $23\_3$.

In the example embodiment of FIG. 5, the digital signal Dlf output from the digital low pass filter 22 may be input to the higher level detection unit $23\_1$ and the lower level detection unit $23\_3$. The higher level detection unit $23\_1$ may detect whether the level of the voltage signal Vlf is greater than or equal to the given first level by detecting the digital signal Dlf. The higher level detection unit $23\_1$ may output a first signal which may be activated (e.g., set to the first logic level, such as a higher logic level or logic "1", as opposed to a second logic level, such as a lower logic level or logic "0") if the voltage signal Vlf is detected to have a level greater than or equal to the given first level.

In the example embodiment of FIG. 5, the lower level detection unit $23\_3$ may detect whether the level of the voltage signal Vlf is less than or equal to the given second level. If the voltage signal Vlf is detected to have a level less than or equal to the given second level, a second signal may be activated (e.g., transitioned from the second logic level to the first logic level) and output. The first signal output from the higher level detection unit $23\_1$ may be output to the state machine 24 as the up-count signal UP, and the second signal output from the lower level detection unit 23_3 may be output to the state machine 24 as the down-count signal DN.

In the example embodiment of FIG. 5 the voltage detection unit 23 may further include a first timer 23_2 and a second timer 23_4. In addition, the voltage detection unit 23 may include a first OR gate OR1 which may receive signals from the higher level detection unit 23_1 and the first timer 23_2 as inputs and may perform an OR operation on the received signals and a second OR gate OR2 which may receive signals from the lower level detection unit 23_3 and the second timer 23_4 as inputs and may performs an OR operation on the received signals.

In the example embodiment of FIG. 5, the higher level detection unit 23_1 may output a first timer control signal CON1 to the first timer 23_2 if the voltage signal Vlf is detected to be substantially equal to the given first level. Alternatively, the higher level detection unit 23_1 may output the first timer control signal CON1 if the voltage signal Vlf is detected to have a level higher than the given first level.

In the example embodiment of FIG. 5, if the level of the voltage signal Vlf becomes greater than or equal to the given first level (e.g., during a gradual increase of the level of the voltage signal Vlf during operation), the voltage detection unit 23 may output the activated up-count signal UP to the state machine 24, and the state machine 24 may increase (e.g., increment) the current N-bit zone control signal (N-BIT DATA) (e.g., by one) and may output the increased N-bit zone control signal (N-BIT DATA). Accordingly, the VCO 15 may select a frequency zone in which the VCO 15 is to operate in a higher frequency zone (e.g., one step higher).

In the example embodiment of FIG. 5, the voltage signal Vlf output from the loop filter 14 and the level of the digital signal Dlf according to the voltage signal Vlf output from the loop filter 14 may increase (e.g., continuously) under certain conditions (e.g., due to a malfunction), even if the N-bit zone control signal (N-BIT DATA) is increased. Accordingly, a phase locking operation may fail because an operation of adjusting (e.g., increasing or decreasing) the N-bit zone control signal (N-BIT DATA) may not be performed after the problem occurs. However, if the first and second timers 23_2 and 23_4 and the first and second OR gates OR1 and OR2 are included as described above, the first timer 23_2 may output a third signal which is activated (e.g., transitioned from the second logic level to the first logic level) at a given time period after receiving the control signal CON1 output from the higher level detection unit 23_1. In addition, the first and third signals may be input signals to the first OR gate OR1 outputting the logic OR operation result of the input signals. Accordingly, because the state machine 24 may output the increased N-bit zone control signal (N-BIT DATA) according to the activated third signal the level of the voltage signal Vlf may be lowered (e.g., in response to a problematic increase of the voltage signal Vlf, such as due to a malfunction).

In the example embodiment of FIG. 5, in a similar fashion, the lower level detection unit 23_3 may output a second timer control signal CON2 to the second timer 23_4, if the voltage signal Vlf is detected to have the same level as the given second level. Alternatively, the lower level detection unit 23_3 may output the second timer control signal CON2 to the second timer 23_4, if the voltage signal Vlf is detected to have a voltage level less than the given second level.

In the example embodiment of FIG. 5, the second timer 23_4 may output a fourth signal which is activated a given time period after the second timer control signal CON2 is received. In addition, the second and fourth signals may be input signals to the second OR gate OR2 outputting the result of the logic OR operation of the input signals. The signal output from the second OR gate OR2 may be input to the state machine 24 as the down-count signal DN.

In the example embodiment of FIG. 5, the level of the voltage signal Vlf may not be increased as the N-bit zone control signal (N-BIT DATA) is decreased (e.g., decremented in steps of one), the state machine 24 may output the decreased N-bit zone control signal (N-BIT DATA) according to the fourth signal, and the level of the voltage signal Vlf may be increased.

Figure 6A:
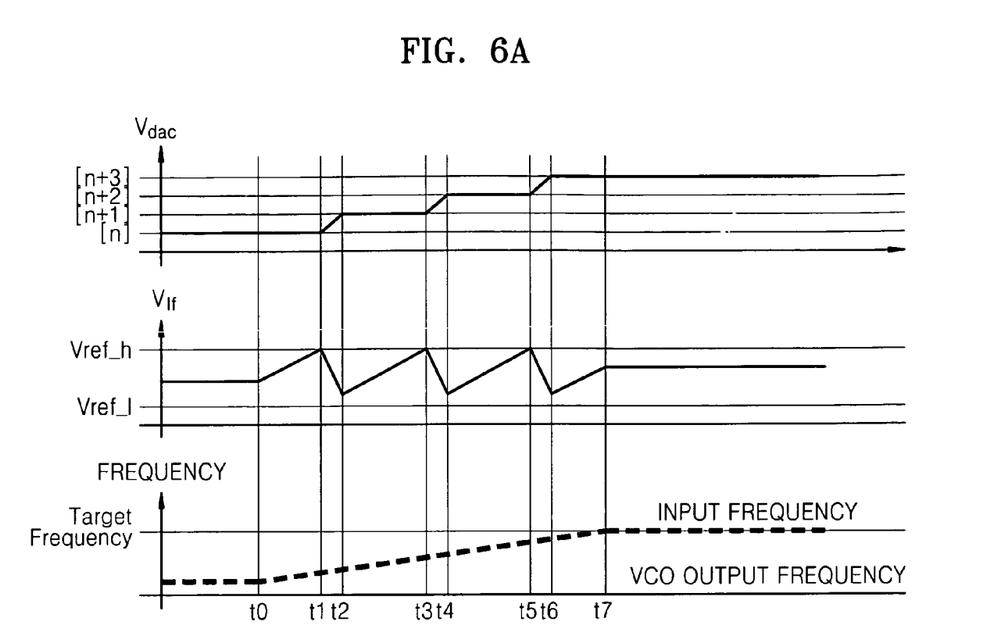
FIGS. 6A and 6B are graphs illustrating voltage-frequency characteristics during an operation of the PLL of FIG. 3 according to another example embodiment of the present invention.
Figure 6B:
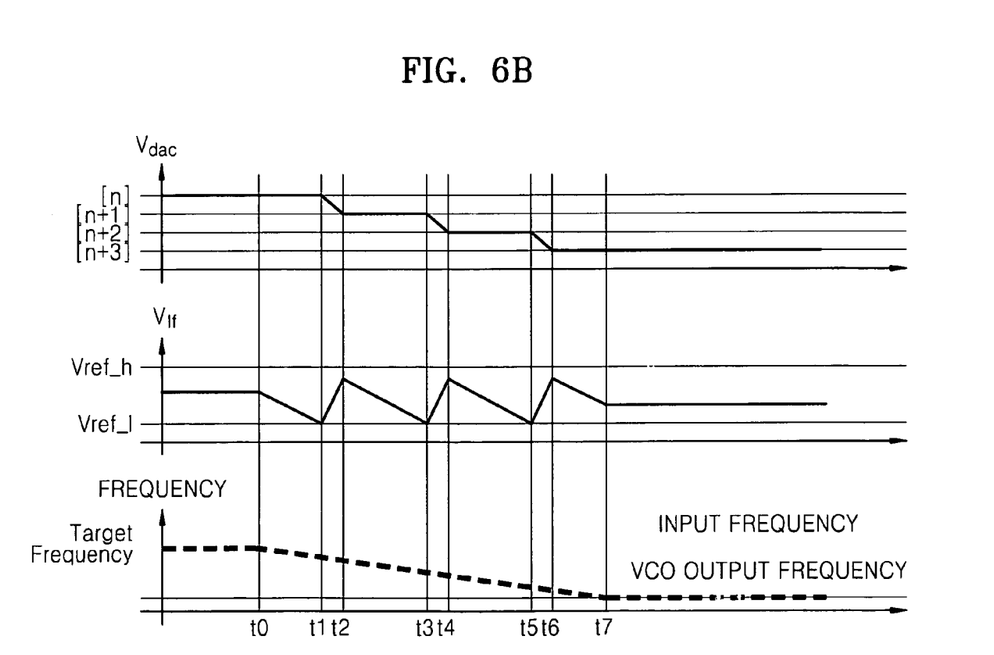

FIGS. 6A and 6B are graphs illustrating voltage-frequency characteristics during an operation of the PLL 10 of FIG. 3 according to another example embodiment of the present invention. In the graphs of FIGS. 6A and 6B, horizontal axes may denote time, and vertical axes may denote frequencies of the control voltage Vdac, the voltage signal Vlf output from the loop filter 14 and the oscillator signal Fvco output from the VCO 15, respectively. In addition, the frequency of the reference signal may be either fixed or variable in the PLL 10 or a clock and data recovery (CDR) and the graph of the voltage-frequency characteristics with respect to the time axis illustrates characteristics where the frequency of the reference signal may start increasing from time t0 and may become fixed at time t7, as an example.

In the example embodiment of FIG. 6A, the frequency of the oscillator signal Fvco generated based on the voltage signal Vlf output from the loop filter 14 may initially be lower than a target frequency (e.g., before time to). The control voltage Vdac input to the VCO 15 at time t0 may be at a step n level control voltage Vdac, and the VCO 15 may operate in a frequency zone corresponding to the level of the control voltage Vdac.

In the example embodiment of FIG. 6A, the frequency of the oscillator signal Fvco may increase as the level of the voltage signal Vlf output from the loop filter 14 increases. If the level of the voltage signal Vlf becomes equal to a first level Vref_h at time t1, the frequency zones control unit 20 may increase (e.g., increment) the N-bit zone control signal (N-BIT DATA) (e.g., by one) and may output the increased N-bit zone control signal (N-BIT DATA) as illustrated from time t1 to t2. Accordingly, the control voltage Vdac output from the digital-analog converter 30 may transition to a step (n+1) level control voltage Vdac.

In the example embodiment of FIG. 6A, because the VCO 15 operates in a one-step higher frequency zone corresponding to the step (n+1) level control voltage Vdac, the level of the voltage signal Vlf may decrease.

In the example embodiment of FIG. 6A, the example operations described above from time t0 to time t2 may repeat so as to increase the frequency of the oscillator signal Fvco until the frequency of the oscillator signal Fvco reaches the target frequency. In other words, the level of the voltage signal Vlf may again increase, and accordingly, the frequency of the oscillator signal Fvco may be increased. If the level of the voltage signal Vlf becomes equal to the first level Vref_h again at time t3, the frequency zones control unit 20 may again increment (e.g., increase) the N-bit zone control signal (N-BIT DATA) (e.g., by one) and may output the increased N-bit zone control signal (N-BIT DATA). Accordingly, the control voltage Vdac output from the digital-analog converter 30 may transition to a next step (e.g., step (n+2)) level control voltage Vdac, and so on. As shown in the example embodiment of FIG. 6A, the frequency of the oscillator signal Fvco may reach the target frequency at time t7 after a number of repetition of the above-described frequency step adjustment process.

In the example embodiment of FIG. 6B, the frequency of the oscillator signal Fvco generated based on a level of the voltage signal Vlf output from the loop filter 14 may initially be larger than the target frequency (e.g., before time t0). The control voltage Vdac input to the VCO 15 from the frequency zones control unit 20 at time t0 may be at a step n level control voltage Vdac, and the VCO 15 may operate in a frequency zone corresponding to the level of the control voltage Vdac.

In the example embodiment of FIG. 6B, the level of the voltage signal Vlf may gradually decrease from time t0 to time t7 because the initial frequency of the oscillator signal Fvco is larger than the target frequency, and accordingly, the frequency of the oscillator signal Fvco may likewise decrease gradually. If the level of the voltage signal Vlf becomes equal to the second level Vref_l at time t1, the frequency zones control unit 20 may decrease (e.g., decrement) the N-bit zone control signal (N-BIT DATA) (e.g., by one) and may output the decreased N-bit zone control signal (N-BIT DATA) as illustrated from time t1 to t2. Accordingly, the control voltage Vdac output from the digital-analog converter 30 may transition to a next step (e.g., step (n−1)) level control voltage Vdac.

In the example embodiment of FIG. 6B, because the VCO 15 may operate in a one-step lower frequency zone corresponding to the step (n−1) level control voltage Vdac, the level of the voltage signal Vlf may increase. As will be appreciated, the step-decrement process may repeat as shown in FIG. 6B until time t7, such that the frequency zone may be continue to be decremented so as to adjust the frequency of the oscillator signal Fvco, and thereby the voltage signal Vlf, during an operation of the PLL 10.

Figure 7A:
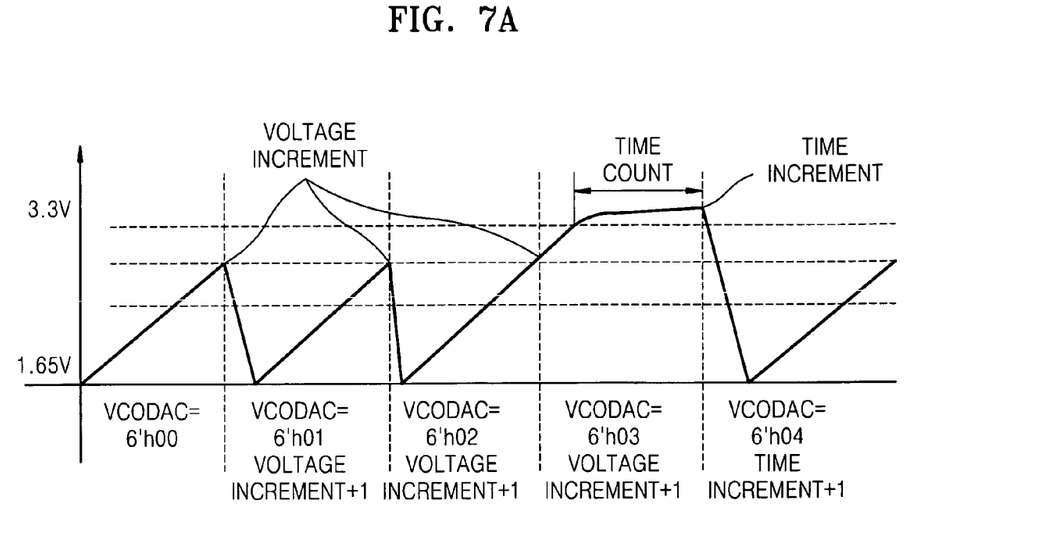
FIGS. 7A and 7B are graphs illustrating voltage-frequency characteristics during an operation of the PLL of FIG. 3 according to another example embodiment of the present invention.
Figure 7B:
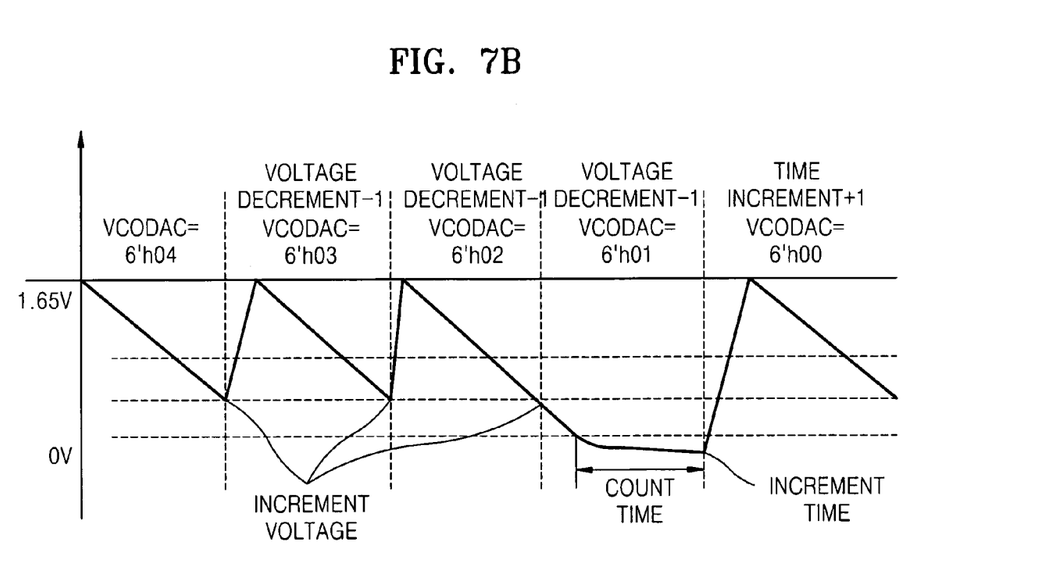

FIGS. 7A and 7B are graphs illustrating voltage-frequency characteristics during an operation of the PLL 10 of FIG. 3 including the first and second timers 23_2 and 23_4 of FIG. 5 according to another example embodiment of the present invention. In the graphs of FIGS. 7A and 7B, horizontal axes may denote time, and vertical axes may denote the level of the voltage signal Vlf output from the loop filter 14. In particular, FIG. 7A illustrates a case where the initial frequency of the initial oscillator signal Fvco generated is lower than the target frequency based on the initial level of the voltage signal Vlf. In an example, the initial level of the voltage signal Vlf may be 1.65 V, and the level of the voltage signal Vlf may increase if the PFD 12 is enabled (e.g., set to the first logic level).

In the example embodiment of FIG. 7A, if a first reference voltage level is set to 2.8 V and the voltage signal Vlf level is increased to 2.8 V, the frequency zone of the VCO 15 may be adjusted to a one-step higher frequency zone, and accordingly, the level of the voltage signal Vlf may be decreased. An example operation of decreasing the level of the voltage signal Vlf to 1.65 V may be based on a characteristic graph of each frequency zone as illustrated in FIG. 7A.

In the example embodiment of FIG. 7A, the level of the voltage signal Vlf may be increased during an operation of the PLL 10 (e.g., due to a malfunction occurring in the PLL 10) even if the level of the voltage signal Vlf has reached 2.8 V, and accordingly, the N-bit zone control signal (N-BIT DATA) output from the state machine 24 may be increased. After the level of the voltage signal Vlf increases above an operation threshold, an operation failure of the PLL 10 may occur because an increase in the N-bit zone control signal (N-BIT DATA) may not occur as described above.

Accordingly, the higher level detection unit 23_1 in FIG. 5 may output the first timer control signal CON1 to the first timer 23_2. In an example, in FIG. 7A, if the level of the voltage signal Vlf is set to a given level (e.g., 3 V) higher than the given first level, the higher level detection unit 23_1 may detect that the voltage disparity and may output the first timer control signal CON1. The first timer 23_2 may output a third signal activated (e.g., set to the first logic level) a given time period after the first timer control signal CON1 is received. Accordingly, an increase or step increment in the N-bit zone control signal (N-BIT DATA) may occur, and the frequency zone of the VCO 15 may thereby transition to a one-step higher frequency zone, and accordingly, the level of the voltage signal Vlf may be decreased.

In the example embodiment of FIG. 7B, the initial frequency of the initial oscillator signal Fvco generated is higher than the target frequency based on the initial level of the voltage signal Vlf. In an example, the initial level of the voltage signal Vlf may be 1.65 V, and the level of the voltage signal Vlf may decrease while the PFD 12 is enabled (e.g., set to the first logic level).

In the example embodiment of FIG. 7B, if the level of the voltage signal Vlf reaches the given second level, a decrease in the N-bit zone control signal (N-BIT DATA) may occur, and accordingly, the frequency zone of the VCO 15 may be adjusted to a one-step lower frequency zone. The lower level detection unit 23_3 may detect if the level of the voltage signal Vlf is less than the given second level and may output the second timer control signal CON2. The second timer 23_4 may output a fourth signal which is activated (e.g., transitioned from the second logic level to the first logic level) at a given time period after the second timer control signal CON2 is received as an input. Accordingly, the N-bit zone control signal (N-BIT DATA) may be decreased, the frequency zone may transition to a one-step lower frequency zone, and the level of the voltage signal Vlf may be increased.

Figure 8A:
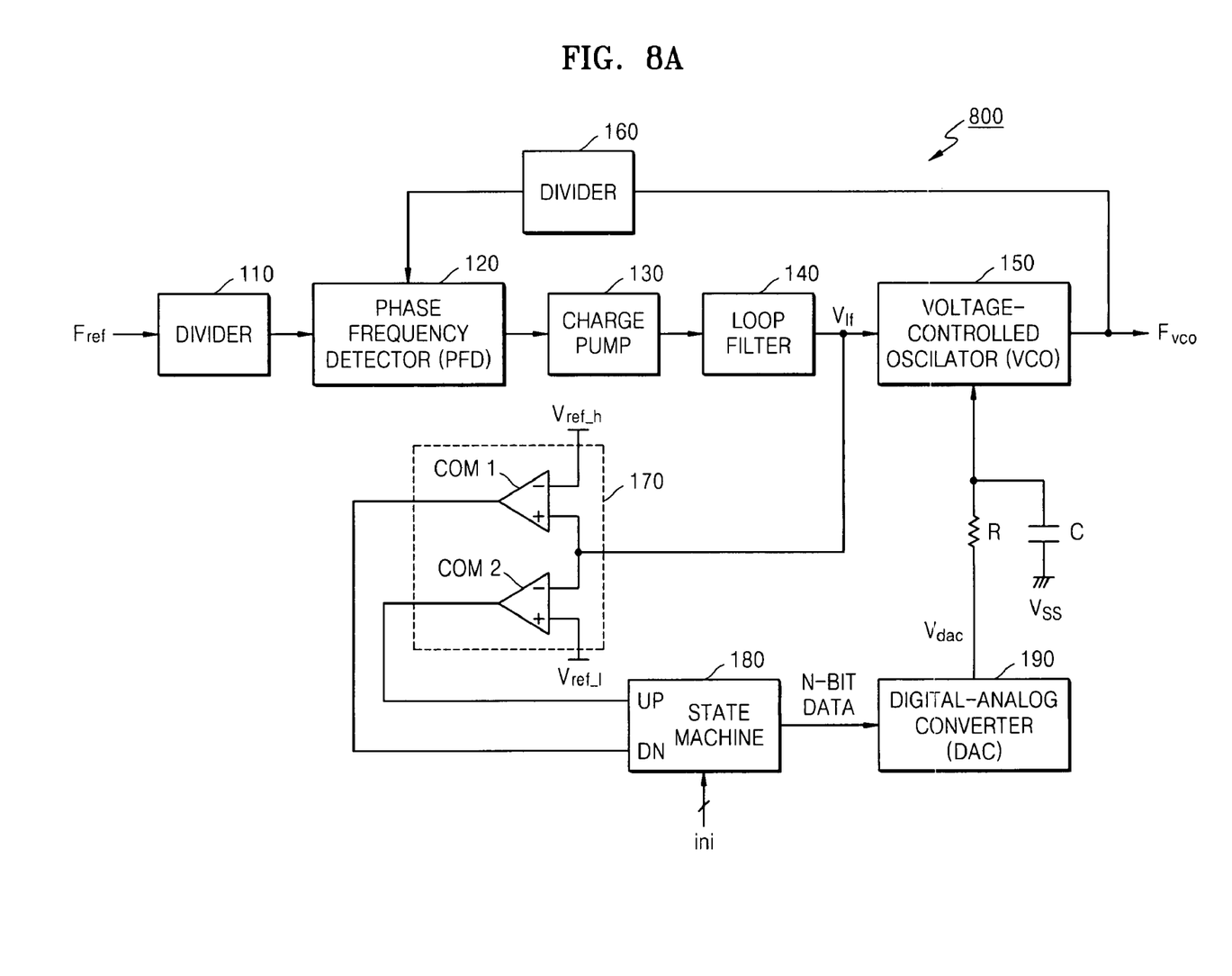
FIGS. 8A and 8B are block diagrams of a PLL according to another example embodiment of the present invention.
Figure 8B:
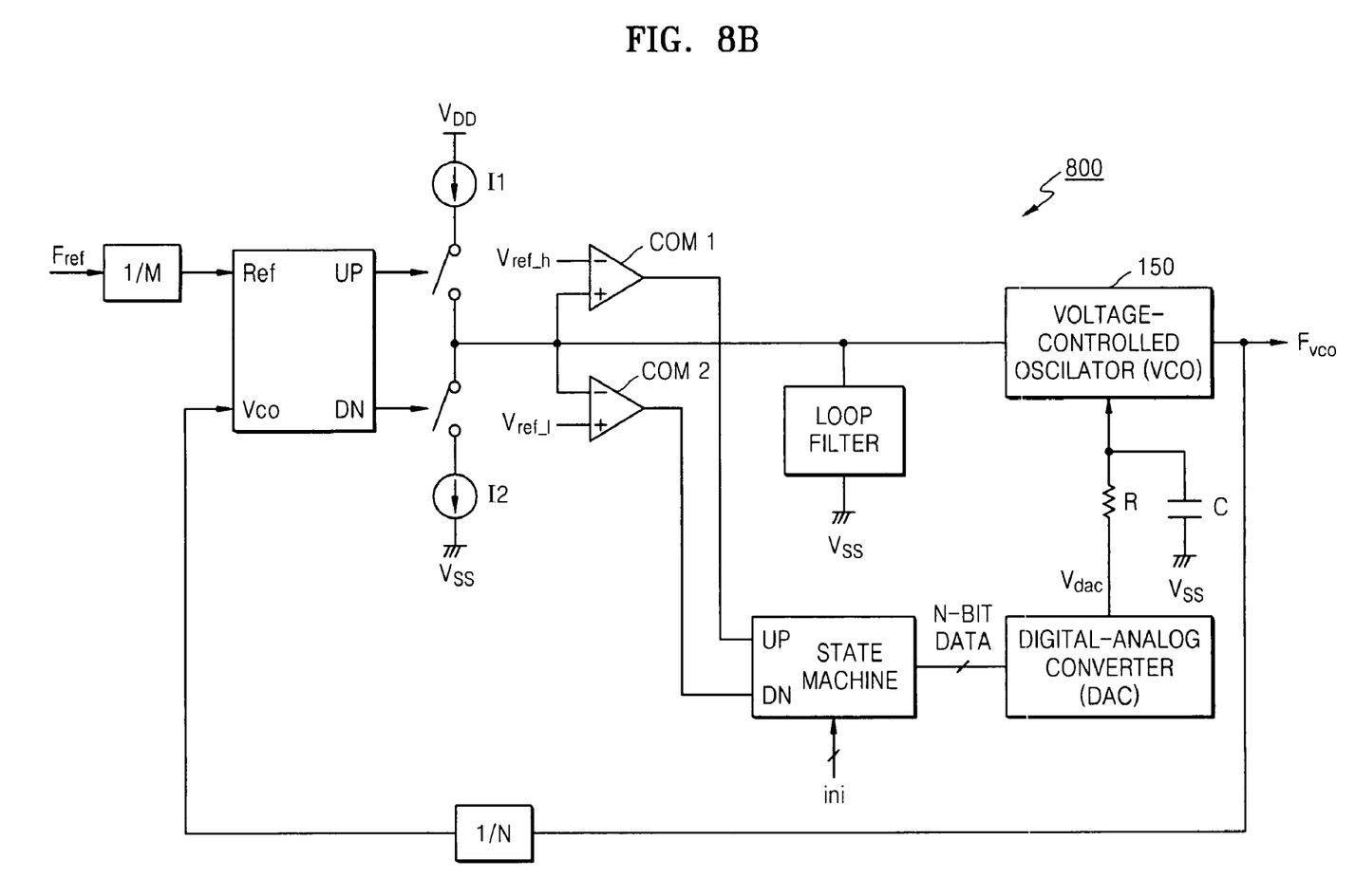

FIGS. 8A and 8B are block diagrams of a PLL 800 according to another example embodiment of the present invention. As illustrated in FIG. 8A, the PLL 800 may include a divider 110, a PFD 120, a charge pump 130, a loop filter 140, a VCO 150 and a divider 160. FIG. 8B illustrates a detailed internal connection of the PLL 800 of FIG. 8A. The charge pump 130 may include current sources I1 and I2 positioned between a voltage source VDD and a ground voltage Vss.

In the example embodiment of FIGS. 8A and 8B, the PLL 800 may further include a comparison unit 170, which may be connected to the loop filter 140, receiving the voltage signal Vlf output from the loop filter 140 as an input. The comparison unit 170 may include first and second comparators COM1 and COM2.

In the example embodiment of FIGS. 8A and 8B, the voltage signal Vlf may be input to terminals of the first and second comparators COM1 and COM2, respectively. The first comparator COM1 may compare the voltage signal Vlf to the first level voltage Vref_h and may output an up-count signal UP, which may be activated if the comparison indicates that the level of the voltage signal Vlf is greater than or equal to that of the first level voltage Vref_h. The second comparator COM2 may compare the voltage signal Vlf to a second level voltage Vref_l and may output a down-count signal DN which may be activated if the comparison indicates that the level of the voltage signal Vlf is less than or equal to that of the second level voltage Vref_l.

In the example embodiments of FIGS. 8A and 8B, the up-count signal UP and the down-count signal DN may be input to the state machine 180. If the up-count signal UP is activated, the state machine 180 may increase (e.g., increment) the N-bit zone control signal (N-BIT DATA) (e.g., by one) and may output the increased N-bit zone control signal (N-BIT DATA). Alternatively, if the down-count signal DN is activated, the state machine 180 may decrease (e.g., decrement) the N-bit zone control signal N-BIT DATA (e.g., by one) and may output the decreased N-bit zone control signal N-BIT DATA.

In the example embodiment of FIGS. 8A and 8B, the N-bit zone control signal N-BIT DATA digital signal output from the state machine 180 may be input to the digital-analog converter 190, and the digital-analog converter 190 may convert the N-bit zone control signal N-BIT DATA digital signal into an analog signal Vdac. The analog signal Vdac may be input to the VCO 150. The VCO 150 may select a frequency zone corresponding to the level of the input analog voltage signal Vdac and may operate according to the voltage-frequency characteristics of the selected frequency zone.

In the example embodiments of FIGS. 8A and 8B, a low-pass filter may be positioned between the digital-analog converter 190 and the VCO 150. The low-pass filter may include a resistor R and a capacitor C. In an example, the frequency zone in the VCO 150 may be adjusted based on the low-pass filter.

Figure 9:
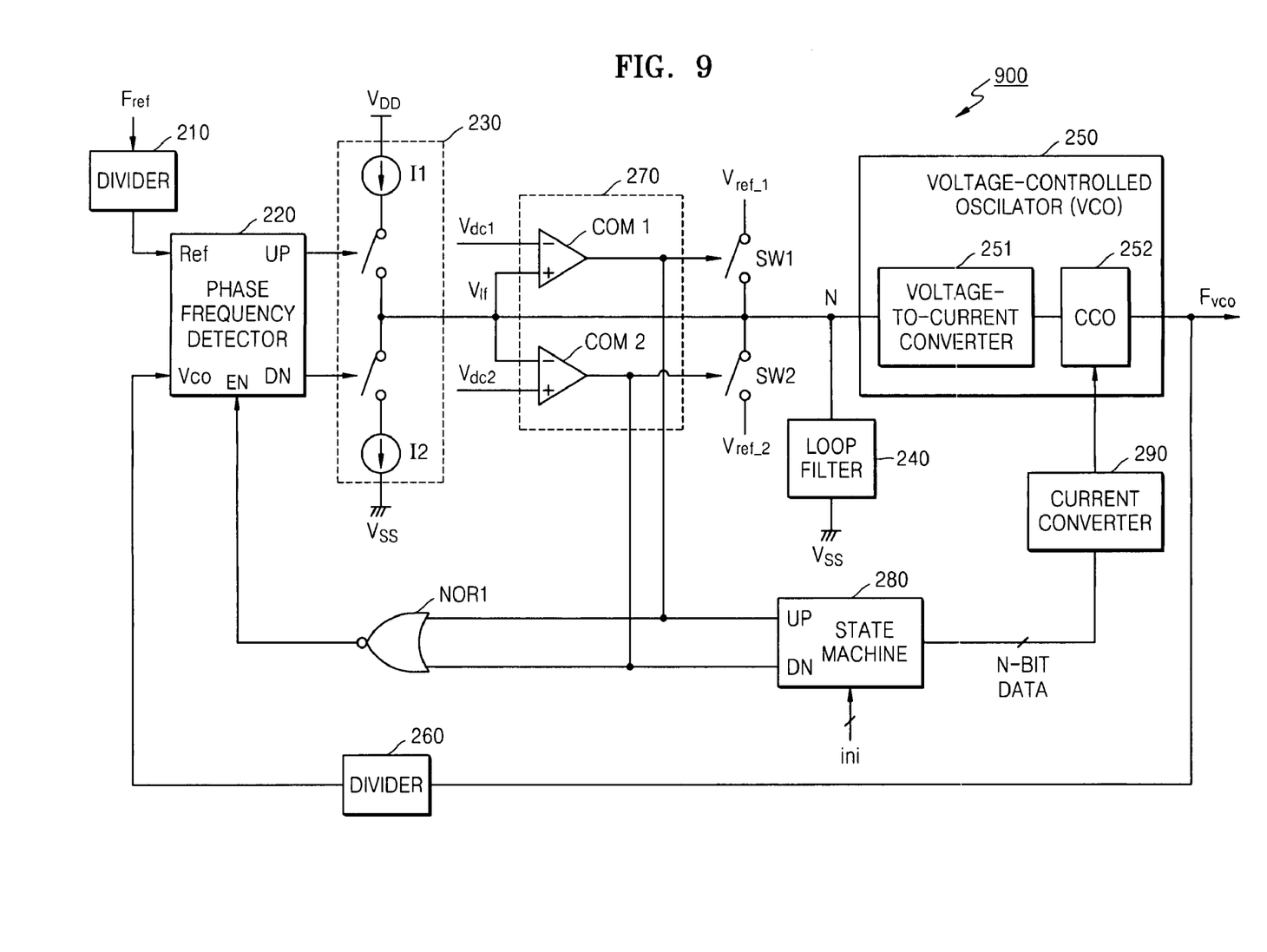
FIG. 9 is a block diagram of a PLL according to another example embodiment of the present invention.

FIG. 9 is a block diagram of a PLL 900 according to another example embodiment of the present invention. In the example embodiment of FIG. 9, the PLL 900 may include a divider 210, a PFD 220, a charge pump 230, a loop filter 240, a VCO 250 and a divider 260. The charge pump 130 may include current sources I1 and I2 positioned between a voltage source VDD and a ground voltage Vss.

In the example embodiment of FIG. 9, the PLL 900 may further include a comparison unit 270, connected to the loop filter 240, receiving the voltage signal Vlf output from the loop filter 140 as an input. The comparison unit 270 may include first and second comparators COM1 and COM2.

In the example embodiment of FIG. 9, a voltage at voltage node N may provide the voltage signal Vlf output from the loop filter 240 and connected to the input terminals of the first and second comparators COM1 and COM2, respectively. The first comparator COM1 may compare the voltage signal Vlf to a first level voltage Vdc1 and may output an up-count signal UP activated (e.g., set to the first logic level) if the level of the voltage signal Vlf is greater than or equal to the level of the first level voltage Vdc1. The second comparator COM2 may compare the voltage signal Vlf to a second level voltage Vdc2 and may output a down-count signal DN activated (e.g., set to the first logic level) if the level of the voltage signal Vlf is less than or equal to the level of the second level voltage Vdc2.

In the example embodiment of FIG. 9, the PLL 900 may further include a switch unit controlled by the activated up-count and down-count signals UP and DN. The switch unit may include a first switch SW1 controlled by the activated up-count signal UP and a second switch SW2 controlled by the activated down-count signal DN.

In the example embodiment of FIG. 9, the first switch SW1 may be switched on by the activated up-count signal UP and may connect the voltage at the voltage node N to a first voltage source Vref1. The second switch SW2 may be switched on by the activated down-count signal DN and may connect the voltage at the voltage node N to a predetermined second voltage source Vref2. In an example, the first voltage source Vref1 may have a level lower than the first level voltage Vdc1, and the second voltage source Vref2 may have a level higher than the second level voltage Vdc2.

In the example embodiment of FIG. 9, the up-count and down-count signals UP and DN may be input to the state machine 280. If the up-count signal UP is activated, the state machine 280 may increase (e.g., increment) the N-bit zone control signal N-BIT DATA (e.g., by one) and may output the increased N-bit zone control signal N-BIT DATA. Alternatively, if the down-count signal DN is activated, the state machine 280 may decrease (e.g., decrement) the N-bit zone control signal N BIT DATA (e.g., by one) and may output the decreased N-bit zone control signal N BIT DATA.

In the example embodiment of FIG. 9, the PLL 900 may include a current converter 290 receiving the N-bit zone control signal N-BIT DATA as an input. The current converter 290 may provide a current to the VCO 250 corresponding to the N-bit zone control signal (N-BIT DATA). The VCO 250 may include a VI converter 251 (e.g., a voltage-to-current converter) and a current controlled oscillator (CCO) 252, where current output from the current converter 290 may be provided to the CCO 252. Accordingly, an oscillator signal Fvco with a frequency corresponding to the voltage at the voltage node N may be generated.

In the example embodiment of FIG. 9, the PLL 900 may disable the PFD 220 if the voltage at the voltage node N transitions a voltage level corresponding to the first voltage source Vref1 and/or the second voltage source Vref2, such that the PFD 220 need not affect the voltage at the voltage node N. A logic operation unit may receive the up-count and down-count signals UP and DN as inputs and may perform a logic operation on the inputs to enable or disable the PFD 220. The logic operation unit may output the result of the logic operation to the PFD 220 as the enable control signal EN. In an example, the logic operation unit may include a NOR gate NOR 1. For example, if one of the up-count and down-count signals UP and DN is activated, an output signal resulting from the logic operation may transition to the second logic level (e.g., a lower logic level or logic "0"), and the enable control signal EN may disable the PFD 220.

In the example embodiment of FIG. 9, if the voltage at the voltage node N transitions to a voltage corresponding to the first or second voltage sources Vref1 or Vref2, the up-count and down-count signals UP and DN may be deactivated. Accordingly, the first and second switches SW1 and SW2 of the switch unit may be turned off. In addition, the signal output from the NOR gate NOR 1 may transition to the first logic level (e.g., a higher logic level or logic "1") because the up-count and down-count signals UP and DN may be deactivated. The PFD 220 may be enabled by the enable control signal EN. The voltage at the voltage node N may be adjusted if the PFD 220 is enabled, and the VCO 250 may generate an oscillator signal Fvco having a frequency corresponding to the voltage at the node N.

Example operation of the PLL 900 illustrated in FIG. 9 will now be described with reference to FIG. 10.

Figure 10:
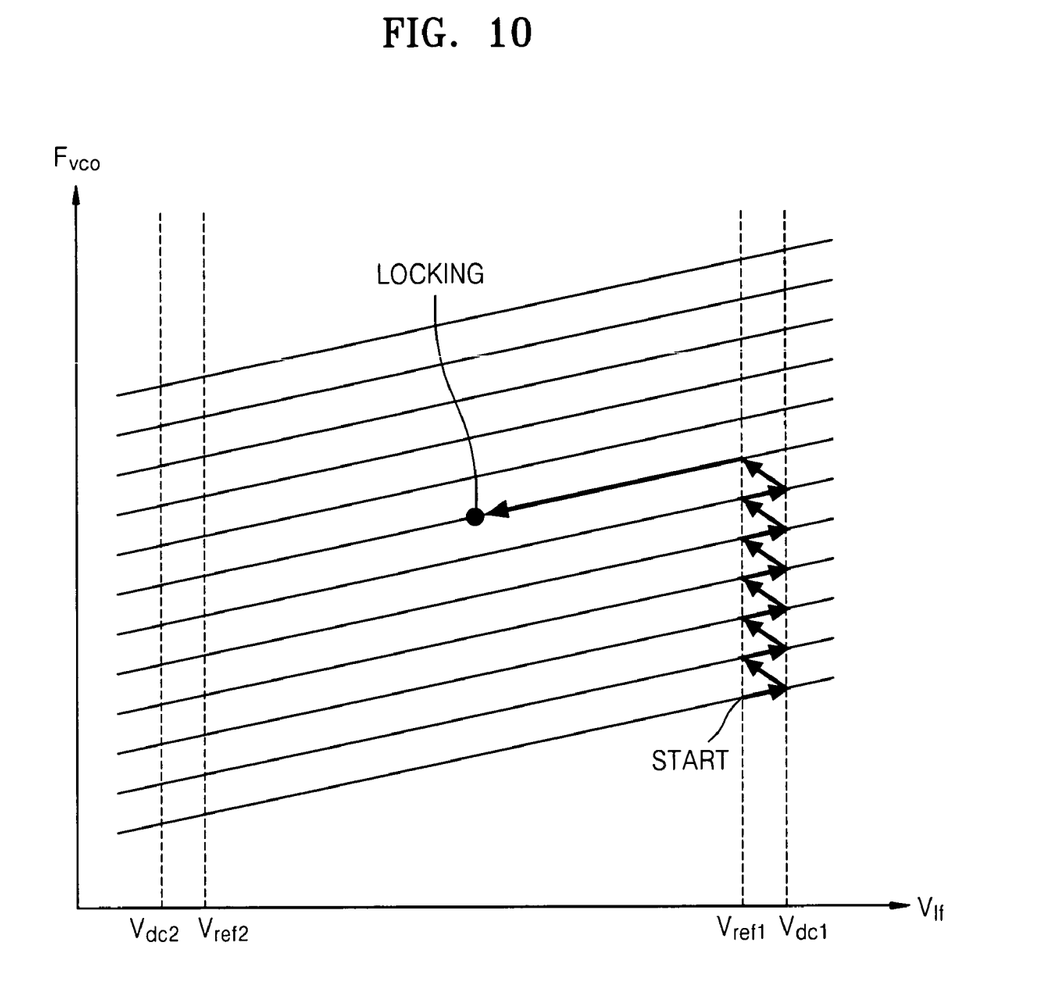
FIG. 10 is a graph illustrating voltage-frequency characteristics during an operation of the PLL of FIG. 9 according to another example embodiment of the present invention.

FIG. 10 is a graph illustrating voltage-frequency characteristics during an operation of the PLL 900 of FIG. 9 according to another example embodiment of the present invention. As illustrated in FIG. 10, the voltage signal Vlf output from the loop filter 240 may initially have a voltage level corresponding to the first voltage fsource Vref1, and the initial frequency of the oscillator signal Fvco corresponding to the voltage signal Vlf output from the loop filter 240 may be lower than a target frequency.

In the example embodiment of FIG. 10, the level of the voltage signal Vlf output from the loop filter 240 may gradually increase in response to an enabling of the PFD 220. The up-count signal UP may be activated (e.g., transitioned to the first logic level) if the level of the voltage signal Vlf is greater than or equal to the level of the first level voltage Vdc1, and the state machine 280 may increase (e.g., increment) the N-bit zone control signal (N-BIT DATA) (e.g., by one) and may output the increased N-bit zone control signal (N-BIT DATA).

In the example embodiment of FIG. 10, the first switch SW1 may be turned on to activate the up-count signal UP, so that the voltage at the voltage node N may be connected to the first voltage source Vref1. Accordingly, a frequency zone in which the VCO 250 operates may transition to a one step higher frequency zone, and the level of the voltage signal Vlf may transition to a level corresponding to the first voltage source Vref1. Because the enable control signal EN output from the NOR gate NOR may disable the PFD 220, the PFD 220 need not affect the voltage at the voltage node N if the level of the voltage signal Vlf corresponds to the first voltage source Vref1.

In the example embodiment of FIG. 10, the up-count and down-count signals UP and DN may be deactivated as the voltage signal Vlf corresponding to the first voltage source Vref1 is input to the comparison unit 270. Accordingly, the switch may be turned off, and the enable control signal EN output from the NOR gate NOR may enable the PFD 220. Thereafter, the frequency of the oscillator signal Fvco may increase as the level of the voltage signal Vlf increases, and the frequency of the oscillator signal Fvco may again reach the target frequency via a reiteration of the above-described processes as shown in FIG. 10.

In another example embodiment of the present invention, a PLL capable of reducing the time required to perform a calibration process while maintaining stable operation irrespective of dynamic changes to operating conditions (e.g., changes to voltage, temperature, etc.). Further, the example PLL may be capable of reducing the time required to perform adjustments, may maintain the level of the voltage signal Vlf of the loop filter operating within an acceptable operating range, Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A phase locked loop, comprising:
   a loop filtering a charge pump output signal to generate a voltage signal;
   a voltage-controlled oscillator configured to operate in a given one of a plurality of frequency zones, the given frequency zone within which the voltage-controller oscillator is operating in being based on a voltage level of the voltage signal, the voltage-controlled oscillator outputting an oscillator signal at a frequency corresponding to the voltage level of the voltage signal output from the loop filter; and
   a frequency zones control unit, connected to the loop filter, receiving the voltage signal of the loop filter as an input, outputting an N-bit zone control signal to select one of the plurality of the frequency zones, the N-bit zone control signal being adjusted in response to the voltage level of the voltage signal, wherein the frequency zones control unit includes:
      an analog-digital converter receiving the voltage signal from the loop filter as an input, converting the received voltage signal into a digital signal, and outputting the digital signal;
      a voltage detection unit receiving the digital signal from the analog-digital converter and detecting the voltage level of the voltage signal of the loop filter based on the digital signal and outputting a detection signal; and
      a state machine adjusting the N-bit zone control signal in response to the detection signal and outputting the adjusted N-bit zone control signal.

2. The phase locked loop of claim 1, further comprising:
   a phase frequency detector comparing phases and frequencies of a reference signal and the oscillator signal; and
   a charge pump pumping charges in response to an output signal of the phase frequency detector to output the charge pump output signal.

3. The phase locked loop of claim 2, further comprising:
   a digital-analog converter positioned between the frequency zones control unit and the voltage-controlled oscillator, the digital-analog converter receiving the N-bit zone control signal as an input, converting the N-bit zone control signal into an analog signal and outputting the analog signal to the voltage-controlled oscillator.

4. The phase locked loop of claim 3, wherein the voltage detection unit activates an up-count signal if the digital signal is at least equal to a first level to increase the N-bit zone control signal, and activates a down-count signal if the digital signal is less than or equal to second level to decrease the N-bit zone control signal.

5. The phase locked loop of claim 4, wherein the voltage detection unit includes:
   a higher level detection unit outputting a first signal activated if the digital signal is at least equal to the first level; and
   a lower level detection unit outputting a second signal activated if the digital signal is less than or equal to the second level.

6. The phase locked loop of claim 5, wherein the voltage detection unit outputs the first and second signals as the up-count and down-count signals to the state machine, respectively.

7. The phase locked loop of claim 5, wherein the voltage detection unit further includes:
   a timer outputting a third signal which is activated at a given time period after a timer control signal is received as an input from the higher level detection unit; and
   an OR gate performing a logic OR operation on the first and third signals and outputting the result of the OR operation to the state machine as the up-count signal.

8. The phase locked loop of claim 7, wherein the higher level detection unit outputs the timer control signal if the digital signal is either at least equal to the first level or a third level, the third level corresponding to a higher voltage than the first level.

9. The phase locked loop of claim 5, wherein the voltage detection unit further includes:
   a timer outputting a third signal which is activated at a given time period after a timer control signal is received as an input from the lower level detection unit; and
   an OR gate performing a logic OR operation on the first and third signals and outputting the result of the OR operation to the state machine as the down-count signal.

10. The phase locked loop of claim 9, wherein the lower level detection unit outputs the timer control signal if the digital signal is either less than or equal to the second level or less than or equal to a third level, the third level corresponding to a lower voltage than the second level.

11. The phase locked loop of claim 3, wherein the frequency zones control unit further includes:
a digital low-pass filter positioned between the analog-digital converter and the voltage detection unit to reduce noise from the voltage signal.

12. The phase locked loop of claim 11, further comprising:
a low pass filter positioned between the digital-analog converter and the voltage-controlled oscillator to reduce a transition time between frequency zones during a frequency zone adjustment.

13. The phase locked loop of claim 2, further comprising:
an initialization signal generation unit outputting an initialization signal to the frequency zones control unit to set an initial value of the N-bit zone control signal.

14. A phase locked loop, comprising:
a loop filter filtering a charge pump output signal to generate a voltage signal;
a voltage-controlled oscillator configured to operate in a given one of a plurality of frequency zones, the given frequency zone within which the voltage-controller oscillator is operating in being based on a voltage level of the voltage signal, the voltage-controlled oscillator outputting an oscillator signal at a frequency corresponding to the voltage level of the voltage signal output from the loop filter;
a comparison unit connected to the loop filter, the comparison unit receiving the voltage signal of the loop filter as an input and selectively outputting one of an up-count signal and a down-count signal based on the voltage level of the voltage signal;
a state machine outputting an N-bit zone control signal to select one of the plurality of frequency zones, the state machine adjusting the N-bit zone control signal based on whether an up-count signal or a down-count signal is received from the comparison; and
a digital-analog converter positioned between the state machine and the voltage-controlled oscillator, the digital-analog converter receiving the N-bit zone control signal as an input, converting the received N-bit zone control signal into an analog signal and outputting the analog signal to the voltage controlled oscillator.

15. The phase locked loop of claim 14, further comprising:
a phase frequency detector comparing phases and frequencies of the reference signal and the oscillator signal; and
a charge pump pumping charges in response to an output signal of the phase frequency detector to output the charge pump output signal.

16. The phase locked loop of claim 14, wherein the comparison unit includes:
a first comparison unit comparing the voltage signal and a first reference voltage and determining whether to output the up-count signal based on the first comparison; and
a second comparison unit comparing the voltage signal and a second reference voltage and determining whether to output the down-count signal based on the second comparison.

17. The phase locked loop of claim 16, wherein the first comparison unit outputs the up-count signal if the voltage level of the voltage signal is greater than or equal to the first reference voltage, and the second comparison unit outputs the down-count signal if the voltage level of the voltage signal is less than or equal to the second reference voltage.

18. The phase locked loop of claim 14, further comprising:
a low pass filter positioned between the digital-analog converter and the voltage-controlled oscillator to reduce a transition between frequency zones during a frequency zone adjustment.

19. The phase locked loop of claim 14, further comprising:
an initialization signal generation unit outputting an initialization signal to the frequency zones control unit to set an initial value of the N-bit zone control signal.

20. A phase locked loop, comprising:
a loop filter filtering a charge pump output signal to generate a voltage signal;
a voltage-controlled oscillator configured to operate in a given one of a plurality of frequency zones, the given frequency zone within which the voltage-controller oscillator is operating in being based on a voltage level of the voltage signal, the voltage-controlled oscillator outputting an oscillator signal at a frequency corresponding to the voltage level of the voltage signal output from the loop filter;
a comparison unit connected to the loop filter, the comparison unit receiving the voltage signal of the loop filter as an input and outputting one of an up-count signal and a down-count signal based on the voltage level of the voltage signal;
a switch unit, which is controlled by the up-count and down-count signals received from the comparison unit, and connected to a voltage node providing the voltage signal of the loop filter to one of a first voltage source and a second voltage source; and
a state machine outputting an N-bit zone control signal to select one of the plurality of frequency zones, the state machine adjusting the N-bit zone control signal based on whether an up-count signal or a down-count signal is received from the comparison unit.

21. The phase locked loop of claim 20, further comprising:
a phase frequency detector comparing the phases and frequencies of the reference signal and the oscillator signal; and
a charge pump pumping charges in response to an output signal of the phase frequency detector to output the charge pump output signal.

22. The phase locked loop of claim 20, wherein the comparison unit includes:
a first comparison unit comparing the voltage signal and a first reference voltage and determining whether to output the up-count signal based on the first comparison; and
a second comparison unit comparing the voltage signal and a second reference voltage and determining whether to output the down-count signal based on the second comparison.

23. The phase locked loop of claim 22, wherein the first comparison unit outputs the up-count signal if the voltage level of the voltage signal is greater than or equal to the first reference voltage, and the second comparison unit outputs the down-count signal if the voltage level of the voltage signal is less than or equal to the second reference voltage.

24. The phase locked loop of claim 23, wherein the switch unit includes:
a first switch connecting the voltage node to the first voltage source if the first comparison unit outputs the up-count signal; and
a second switch connecting the voltage node to the second voltage source if the second comparison unit outputs the down-count signal.

25. The phase locked loop of claim 24, wherein the first voltage source is lower than the first reference voltage, and the second voltage source is higher than the second reference voltage.

26. The phase locked loop of claim 25, further comprising:
a logic operation unit performing a logic operation on the received up-count and down-count signals and outputting the result of the logic operation to the phase frequency detector as one of an enable signal and a disable signal, the enable or disable signal controlling a status of the phase detector if the voltage at the voltage node transitions to a voltage corresponding to one of the first voltage source and the second voltage source.

27. The phase locked loop of claim 26, wherein the logic operation unit includes a NOR gate performing a NOR operation on the up-count and down-count signals.

28. The phase locked loop of claim 20, further comprising:
an initialization signal generation unit outputting an initialization signal to the frequency zones control unit to set an initial value of the N-bit zone control signal.

29. A method of operating a phase locked loop, comprising:
filtering, using a loop filter, a charge pump output signal to generate a voltage signal;
outputting, using a voltage-controlled oscillator, an oscillator signal at a frequency corresponding to a voltage level of the voltage signal, the frequency of the oscillator signal based on which of a plurality of frequency zones is currently selected, the currently selected frequency zone being selected based on the voltage level of the voltage signal; and
outputting, using a frequency zones control unit, an N-bit zone control signal using the voltage signal output from the loop filter to select one of the plurality of frequency zones, the N-bit zone control signal being adjusted in response to the voltage level of the voltage signal, wherein outputting the N-bit zone control signal includes
converting, using an analog-digital converter, the voltage signal from the loop filter into a digital signal, and outputting the digital signal:
detecting, using a voltage detection unit, the voltage level of the voltage signal output from the loop filter based on the digital signal and outputting a detection signal; and
adjusting, using a state machine, the N-bit zone control signal in response to the detection signal and outputting the adjusted N-bit zone control signal.

30. The method of claim 29, wherein the currently selected frequency zone transitions to a higher of the plurality of frequency zones if the voltage level of the voltage signal is at least equal to a first reference voltage, and the currently selected frequency zone transitions to a lower of the plurality of frequency zones if the voltage level of the voltage signal is less than or equal to a second reference voltage.

* * * * *